United States Patent
Shei et al.

(10) Patent No.: US 7,482,696 B2
(45) Date of Patent: Jan. 27, 2009

(54) LIGHT-EMITTING DIODE PACKAGE STRUCTURE

(75) Inventors: Shih-Chang Shei, Tainan (TW); Jinn-Kong Sheu, Jiangjyun Township, Tainan County (TW)

(73) Assignee: South Epitaxy Corporation, Tainan (TW)

( * ) Notice: Subject to any disclaimer, the term of this patent is extended or adjusted under 35 U.S.C. 154(b) by 568 days.

(21) Appl. No.: 10/826,003

(22) Filed: Apr. 16, 2004

(65) Prior Publication Data

US 2005/0127485 A1    Jun. 16, 2005

(30) Foreign Application Priority Data

Dec. 11, 2003  (TW) ............................. 92134974 A

(51) Int. Cl.
*H01L 29/18* (2006.01)
(52) U.S. Cl. .................... 257/778; 257/99; 257/678
(58) Field of Classification Search .............. 257/99, 257/678, 778
See application file for complete search history.

(56) References Cited

U.S. PATENT DOCUMENTS

| 5,298,768 | A  | * | 3/1994 | Okazaki et al. ............. 257/81 |
| 6,445,011 | B1 | * | 9/2002 | Hirano et al. ............... 257/99 |
| 2002/0008325 | A1 | * | 1/2002 | Tominaga .................. 257/778 |

* cited by examiner

*Primary Examiner*—Leonardo Andújar
(74) *Attorney, Agent, or Firm*—J.C. Patents

(57) ABSTRACT

A light-emitting diode package structure is provided. The light-emitting diode package comprises an insulating sub-mount, a first patterned conductive-reflective film, a second patterned conductive-reflective film and a light-emitting diode chip. The insulating sub-mount has a first surface and a cavity therein. The first and the second patterned conductive-reflective film are set over a portion of the first surface, a portion of the sidewalls of the cavity and a portion of the bottom surface of the cavity. The light-emitting diode chip is set up inside the cavity of the insulating sub-mount. The light-emitting diode has a pair of electrodes. The electrodes are electrically connected to the first and the second patterned conductive-reflective film respectively. Since the light-emitting diode structure of this invention incorporates the patterned conductive-reflective films, efficiency of the light-emitting diode is increased.

8 Claims, 3 Drawing Sheets

LIGHT-EMITTING DIODE PACKAGE STRUCTURE

CROSS-REFERENCE TO RELATED APPLICATION

This application claims the priority benefit of Taiwan application serial no. 92134974, filed on Dec. 11, 2003.

BACKGROUND OF THE INVENTION

1. Field of the Invention

The present invention relates to a light-emitting diode (LED) package structure. More particularly, the present invention relates to a light-emitting diode package, which can enhance the efficiency thereof.

2. Description of the Related Art

Light-emitting diode fabricated using a semiconductor compound formed from group III-N semiconductors is a light emitter with a wide bandgap. In general, the light-emitting diode is able to emit light with a wide specrum, that is, from the infrared to the ultraviolet. The basic structure of an LED device includes a P-type and an N-type epitaxial layer fabricated using a compound of the III-V semiconductors and a light-emitting layer sandwiched between the two epitaxial layers. In general, the light-emitting efficiency of the LED device depends on the internal quantum efficiency of the light-emitting layer and the light extraction efficiency of the device. The internal quantum efficiency can be increased through any improvement in crystal quality and the structural design of the light-emitting layer. The light extraction efficiency, on the other hand, can be increased through a reduction in the energy loss due to total internal reflection of light emitted by the light-emitting layer within the LED chip.

At present, the anode and the cathode of a gallium nitride (GaN) LED device grown on sapphire are set up on the same side with both the anode and the cathode capable of reflecting light. Hence, most high efficiency GaN/sapphire LED deploys a flip-chip package design so that the anode and the cathode face the non-transparent package substrate called submount. Furthermore, a reflective layer is also formed on the epitaxial layer facing the package substrate so that most of the light is emitted from the opposite side of the anode and the cathode. Another advantage of using a flip-chip design is that, together with a suitable sub-mount such as a silicon substrate, the thermal characteristics of the device can be enhanced when the device operates with a large current. As a result, not only is the light extraction efficiency of the LED increased, the internal quantum efficiency of the LED is also sustained due to rapid heat dissipation.

In the aforementioned light-emitting diode with a flip-chip package design, the degree of shielding by the non-transparent anode and cathode is greatly reduced so that overall light-emitting efficiency is increased. In addition, the rate of heat dissipation from the device is also increased so that the device can have a longer lifetime. However, light emitted from the lateral surfaces of the light-emitting diode is never utilized effectively.

SUMMARY OF THE INVENTION

Accordingly, one objective of the present invention is to provide a light-emitting diode package with a patterned conductive-reflective film therein for increasing the light-emitting efficiency.

To achieve these and other advantages and in accordance with the purpose of the invention, as embodied and broadly described herein, the invention provides a light-emitting diode package structure. The light-emitting diode package structure comprises an insulating sub-mount, a first patterned conductive-reflective film, a second patterned conductive-reflective film and a light-emitting diode chip. The insulating sub-mount has a first surface with a cavity therein. The first patterned conductive-reflective film is set up on a portion of the first surface, a first sidewall of the cavity and a bottom surface of the cavity. The second patterned conductive-reflective film is set up on a portion of the first surface, a second sidewall of the cavity and a bottom surface of the cavity. The light-emitting diode chip is positioned inside the cavity of the insulating sub-mount. The light-emitting diode has a pair of electrodes. The electrodes are electrically connected to the first patterned conductive-reflective film and the second patterned conductive-reflective film respectively.

According to the aforementioned structure, the light-emitting diode package further comprises a pair of bumps set up between each electrode of the light-emitting diode and the first patterned conductive-reflective film and the second patterned conductive-reflective film respectively. Furthermore, the bumps are fabricated using lead-tin, Au or Au—Sn alloy or a conductive material, for example. The insulating sub-mount is fabricated using aluminum nitride (AlN), GaAs, SiC, boron nitride (BN), beryllium oxide (BeO), zinc oxide or silicon, for example. In addition, the light-emitting diode package further includes a pair of bonding pads set up on the first patterned conductive-reflective film and the second patterned conductive-reflective film respectively. The bonding pads are suitable for connecting electrically with an external printed circuit board. Note that the sidewall and the bottom surface of the cavity in the light-emitting diode package forms an obtuse angle.

This invention also provides an alternative light-emitting diode package structure. The light-emitting diode package structure comprises a semiconductor sub-mount, a first patterned conductive-reflective film, a second patterned conductive-reflective film and a light-emitting diode chip. The semiconductor sub-mount has a first surface with a cavity therein. The first patterned conductive-reflective film is set up on a portion of the first surface, a first sidewall of the cavity and a bottom surface of the cavity. The second patterned conductive-reflective film is set up on a portion of the first surface, a second sidewall of the cavity and a bottom surface of the cavity. The light-emitting diode chip is positioned inside the cavity of the insulating sub-mount. The light-emitting diode has a pair of electrodes. The electrodes are electrically connected to the first patterned conductive-reflective film and the second patterned conductive-reflective film respectively.

According to the alternative embodiment of this invention, the light-emitting diode package further comprises a pair of bumps set up between each electrode of the light-emitting diode and the first patterned conductive-reflective film and the second patterned conductive-reflective film respectively. Furthermore, the bumps are fabricated using lead-tin alloy Au—Sn, Au or other conductive material, for example. The light-emitting diode package further includes a pair of bonding pads set up on the first patterned conductive-reflective film and the second patterned conductive-reflective film respectively. The bonding pads are suitable for connecting electrically with an external printed circuit board. Note that the sidewall and the bottom surface of the cavity in the light-emitting diode package forms an obtuse angle.

Furthermore, in the alternative embodiment of this invention, the semiconductor sub-mount is fabricated using silicon or gallium arsenic compound, for example. Note that the semiconductor sub-mount comprises a first conductive type semiconductor sub-mount, a second conductive type region and an insulating layer. The first conductive type semiconductor sub-mount has a second conductive type region. The insulating layer is set up over the first conductive type semiconductor sub-mount. One of the electrodes is electrically connected to the second conductive type region but electrically isolated from the first conductive type semiconductor sub-mount through the insulating layer. In the aforementioned light-emitting diode package, the first conductive type semiconductor sub-mount is an N-doped material layer and the second conductive type region is a P-doped material layer. Alternatively, the first conductive type semiconductor sub-mount is a P-doped material layer and the second conductive type region is an N-doped material layer, for example.

Accordingly, the light-emitting diode package of this invention has patterned conductive-reflective films therein for deflecting light emerging from the lateral surfaces of the light-emitting diode to an output surface. Thus, the light-emitting diode package can have a higher light emission efficiency.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
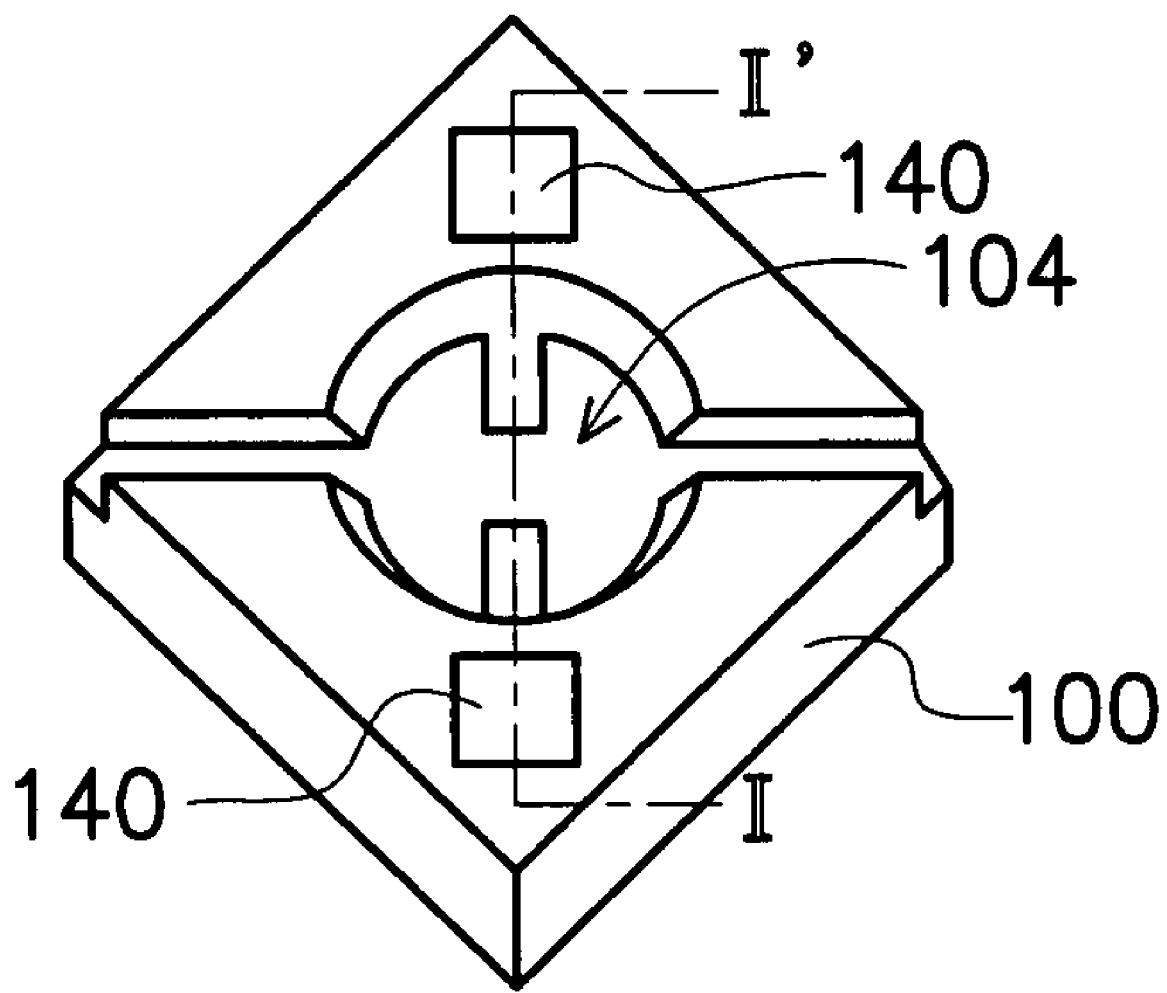
FIG. 1 is a perspective view of a light-emitting diode package according to a first preferred embodiment of present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
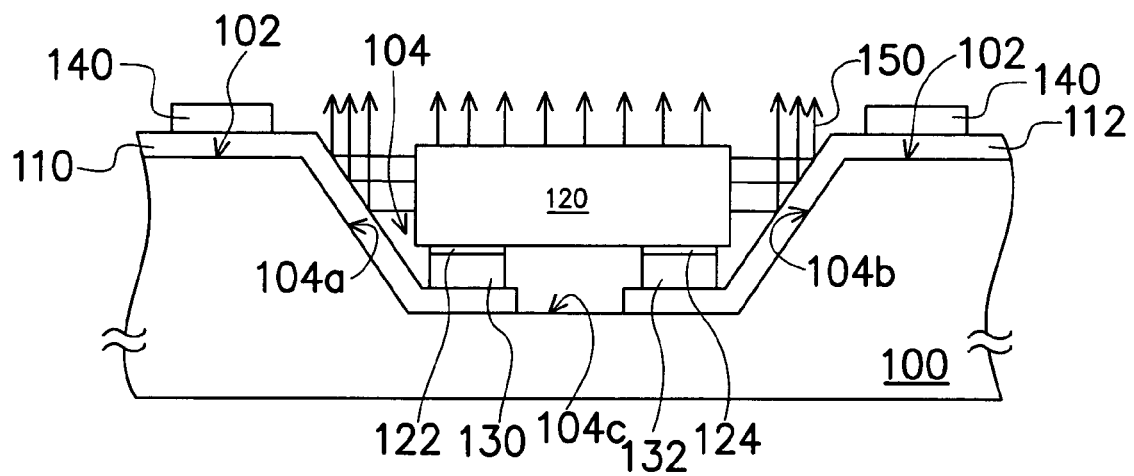
FIG. 2 is a schematic cross-sectional view of a light-emitting diode package according to the first preferred embodiment of present invention.

FIG. 1 is a perspective view of a light-emitting diode package according to a first preferred embodiment of present invention. FIG. 2 is a schematic cross-sectional view of a light-emitting diode package according to the first preferred embodiment of present invention. In fact, FIG. 2 is a cross-section along line I-I' in FIG. 1. As shown in FIGS. 1 and 2, the light-emitting diode package structure of present invention comprises an insulating sub-mount 100, a first patterned conductive-reflective film 110, a second patterned conductive-reflective film 112 and a light-emitting diode chip 120. The insulating sub-mount 100 has a first surface 102 with a cavity 104 therein. The insulating sub-mount 100 is fabricated using aluminum nitride (AlN), boron nitride (BN), beryllium oxide (BeO) or silicon, for example. Typically, the insulating sub-mount 100 has a high heat-dissipating capacity. The cavity 104 in the insulating sub-mount 100 further comprises a first sidewall 104a, a second sidewall 104b and a bottom surface 104c. The patterned conductive-reflective film 110 is set up on a portion of the first surface 102, the first sidewall 104a of the cavity 104 and the bottom surface 104c of the cavity 104. Similarly, the patterned conductive-reflective film 112 is set up on a portion of the first surface 102, the first sidewall 104b of the cavity 104 and the bottom surface 104c of the cavity 104.

The light-emitting diode chip 120 is set up in the cavity 104 of the insulating sub-mount 100 using a flip-chip bonding technique. The light-emitting diode chip 120 has a pair of electrodes 122 and 124. A pair of bumps 130 and 132 is set up on the respective patterned conductive-reflective films 110 and 112. In addition, the bumps 130 and 132 are electrically connected to the electrodes 122 and 124 of the light-emitting diode chip 120 respectively. It should be note that the light-emitting diode package of this embodiment further comprises a pair of bonding pads 140 set up on the first patterned conductive-reflective film 110 and the second patterned conductive-reflective film 112 for electrically connecting with an external printed circuit board (not shown). The type of electrical connection includes wire bonding, for example. Furthermore, the first sidewall 104a and the bottom surface 104c of the cavity 104 as well as the sidewall 104b and the bottom surface 104c form an obtuse angle.

As shown in the aforementioned light-emitting diode package, light 150 from the light-emitting diode chip 120, especially the light output from the lateral surfaces of the light-emitting diode chip 120, is deflected through the patterned conductive-reflective films 110 and 112 to a light-emerging surface (not shown). Hence, light emission efficiency of the light-emitting diode 120 is increased.

In the first embodiment of this invention, the insulating sub-mount is not necessarily fabricated using insulating materials such as the aforementioned aluminum nitride, silicon, boron nitride or beryllium oxide. The sub-mount can be fabricated using a conductive material such as a semiconductor material. A semiconductor sub-mount is used in the following light-emitting diode package.

Figure 3:
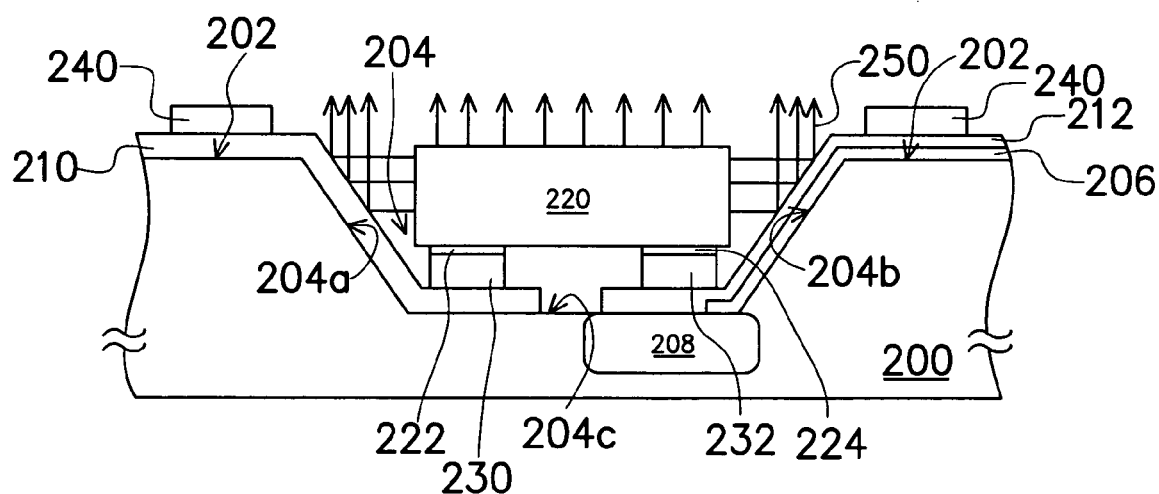
FIG. 3 is a schematic cross-sectional view of a light-emitting diode package according to a second preferred embodiment of present invention.

FIG. 3 is a schematic cross-sectional view of a light-emitting diode package according to a second preferred embodiment of present invention. FIG. 3 is a cross-section along line I-I' in FIG. 1. As shown in FIGS. 1 and 3, the light-emitting diode package structure comprises a semiconductor sub-mount 200, a first patterned conductive-reflective film 210, a second patterned conductive-reflective film 212 and a light-emitting diode chip 220. The semiconductor sub-mount 200 has a first surface 202 with a cavity 204 therein. The cavity 204 in the semiconductor sub-mount 200 further comprises a first sidewall 204a, a second sidewall 204b and a bottom surface 204c. The semiconductor sub-mount 200 comprises an N-doped silicon substrate (not labeled), a P-doped region 208 and an insulating layer 206, for example. The insulating layer 206 is set up over a portion of the N-doped silicon substrate (unlabeled) and the P-doped region 208. The insulating layer 206 is fabricated using silicon dioxide, for example. The patterned conductive-reflective film 210 is set up on a portion of the first surface 202, the first sidewall 204a of the cavity 204 and the bottom surface 204c of the cavity 204. In other words, the patterned conductive-reflective film 210 is set up on a portion of the N-doped silicon substrate (unlabeled) to form an ohmic contact. Similarly, the patterned conductive-reflective film 212 is set up on a portion of the first surface 202, the first sidewall 204b of the cavity 204 and the bottom surface 204c of the cavity 204. In other words, the patterned conductive-reflective 212 and the P-doped region 208 are electrically connected (to form an ohmic contact). Moreover, the N-doped silicon substrate (unlabeled) and the P-doped region 208 are electrically isolated through the insulating layer 206.

The light-emitting diode chip 220 is set up inside the cavity 204 of the semiconductor sub-mount 200 using a flip-chip bonding technique. The light-emitting diode chip 220 has a pair of electrodes 222 and 224. The electrode 222 is an anode set up on the P-doped layer and the electrode 224 is a cathode set up on the N-doped layer, for example. A pair of bumps 230 and 232 is set up on the respective patterned conductive-reflective films 210 and 212. The bumps 230 and 232 are electrically connected to the electrodes 222 and 224 of the light-emitting diode chip 220 respectively. Note that the light-emitting diode package of this embodiment further comprises a pair of bonding pads 240 set up on the first patterned conductive-reflective film 210 and the second patterned conductive-reflective film 212 for connecting electrically with an external printed circuit board (not shown). The type of electrical connection includes wire bonding, for example.

In the second embodiment of this invention, the semiconductor sub-mount 200 may have a P-doped silicon substrate and an N-doped region. Thus, the electrode 222 is set up on the N-doped layer of the light-emitting diode chip 220 and the electrode 224 is set up on the P-doped layer of the light-emitting diode chip 220, and the doped region 208 is n-type material.

Figure 4:
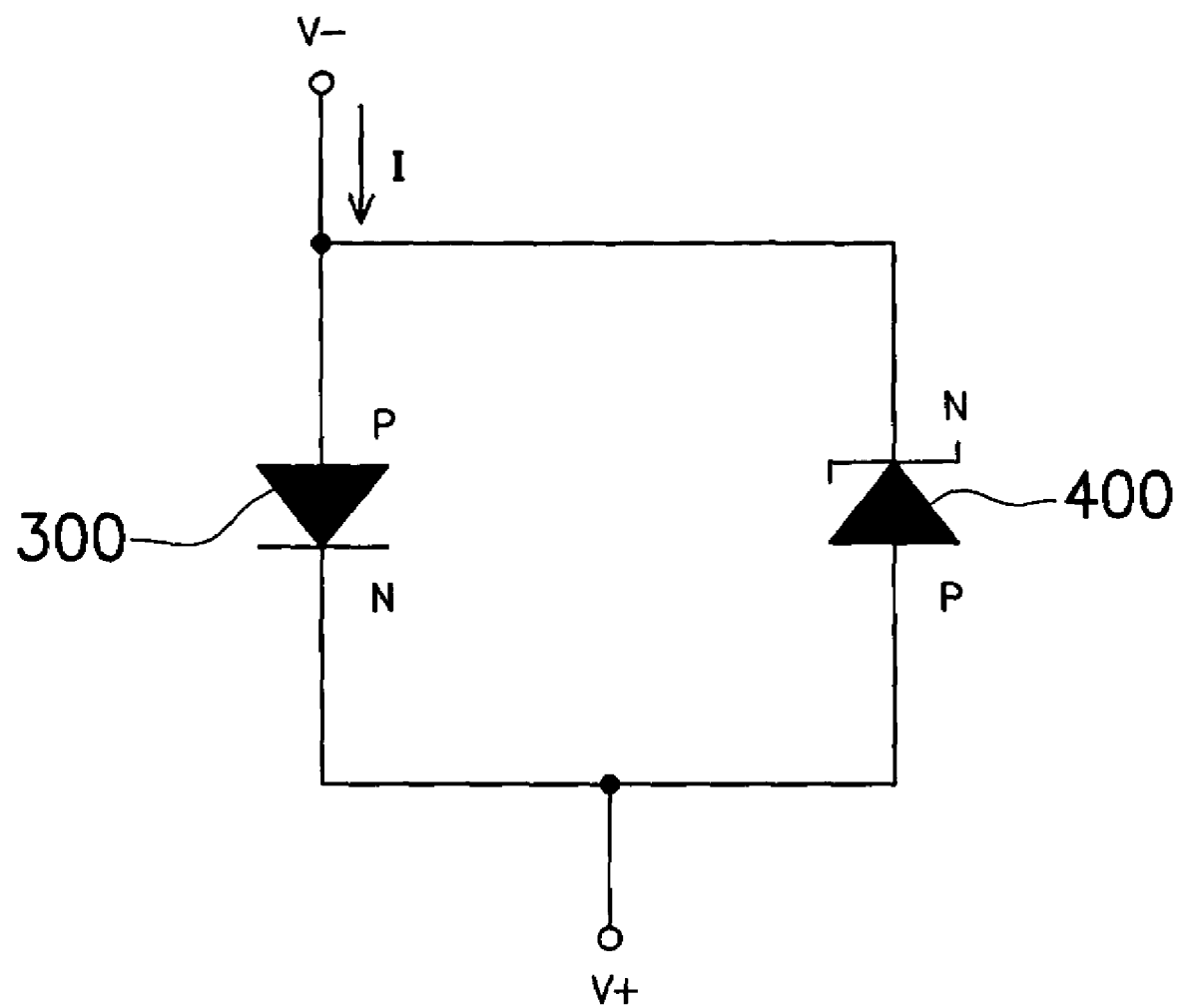
FIG. 4 is an equivalent circuit diagram of the light-emitting diode package according to the second preferred embodiment of present invention.

Note that the semiconductor sub-mount in the second embodiment has an N-doped silicon substrate and a P-doped region 208. Thus, a shunt diode circuit is formed so that any unexpected electrostatic discharge that may result in some damage to the light-emitting diode chip is bypassed. FIG. 4 is an equivalent circuit diagram of the light-emitting diode package according to the second preferred embodiment of present invention. As shown in FIGS. 3 and 4, the equivalent circuit of the light-emitting diode structure comprises a light-emitting diode 300 and a shunt diode 400. The shunt diode 400 is a silicon-doped diode, for example. To prevent any electrostatic discharge from damaging the light-emitting diode 300 during operation, the shunt diode 400 and the light-emitting diode 300 are connected in parallel. Because the shunt diode 400 operates in the breakdown region, the diode 300 is maintained in a conductive state. When a positive bias voltage is applied to the V+ and the V− terminal of the light-emitting diode 300, the carrier passing through the P-N junction of the light-emitting diode 300 generates a forward current so that the light-emitting diode 300 emits light. However, when an abnormal voltage is applied or when there is an electrostatic discharge, the excess voltage will be discharged through the shunt diode 400 operating in the breakdown region. Hence, abnormal current bypasses the light-emitting diode 300 to prevent any damage.

In summary, major advantages of the light-emitting diode package according to this invention include:

1. A light-emitting diode chip is flip-chip bonded to the cavity of an insulating sub-mount. Furthermore, the insulating sub-mount has patterned conductive-reflective films thereon for reflecting light emitted from the lateral surface of the light-emitting diode to the light emerging surface. Hence, the light emission efficiency of the light-emitting diode is increased. In addition, the insulating sub-mount can be fabricated using a material with high heat-dissipating capacity such as aluminum nitride, boron nitride or zinc oxide. As a result, the average working life of the light-emitting diode is extended.

2. A light-emitting diode chip is flip-chip bonded to the cavity of a semiconductor sub-mount. Furthermore, the semiconductor sub-mount has patterned conductive-reflective films thereon for reflecting light emitted from the lateral surface of the light-emitting diode to the light emerging surface. Hence, the light emission efficiency of the light-emitting diode is increased. In addition, the semiconductor sub-mount has a shunt diode that prevents any electrostatic discharge from damaging the light-emitting diode chip. Thus, the average working life of the light-emitting diode chip is extended.

3. The light-emitting diode chip is flip-chip bonded to the bottom surface of the cavity structure inside the sub-mount. Hence, overall thickness of the light-emitting diode package is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode package structure, comprising:
   a semiconductor sub-mount having a first surface with a cavity therein and comprising a first conductive type semiconductor substrate and a second conductive type region enclosed by the first conductive type semiconductor substrate;
   a first patterned conductive-reflective film set up on a portion of the first surface, a first sidewall of the cavity and a bottom surface of the cavity, wherein the first patterned conductive-reflective film contacts with the first sidewall of the cavity and a part of the first conductive type semiconductor substrate;
   a second patterned conductive-reflective film set up on a portion of the first surface, a second sidewall of the cavity and a bottom surface of the cavity, wherein the second patterned conductive-reflective film covers the second sidewall of the cavity;
   an insulating layer only set up in-between the semiconductor sub-mount and the second patterned conductive-reflective film; and
   a light-emitting diode chip set up inside the cavity of the semiconductor sub-mount, wherein the light-emitting diode has a first electrode and a second electrode electrically connected to the first patterned conductive-reflective film and the second patterned conductive-reflective film.

2. The light-emitting diode package structure of claim 1, wherein the package further comprises a pair of bumps set up between the first electrode of the light-emitting diode and the first patterned conductive-reflective film as well as the second electrode of the light-emitting diode and the second patterned conductive-reflective film.

3. The light-emitting diode package structure of claim 2, wherein material constituting the bumps comprises lead-tin, gold-tin alloy or gold.

4. The light-emitting diode package structure of claim 1, wherein the package further comprises a first bonding pad and a second bonding pad set up on the first patterned conductive-reflective film and the second patterned conductive-reflective film for connecting electrically with an external circuit board.

5. The light-emitting diode package structure of claim 1, wherein the sidewall and the bottom surface of the cavity form an obtuse angle.

6. The light-emitting diode package structure of claim 1, wherein material constituting the semiconductor sub-mount comprises silicon, gallium arsenide, SiC, or zinc oxide.

7. The light-emitting diode package structure of claim 6, wherein the first conductive type semiconductor substrate is an N-doped material layer and the second conductive type region is a P-doped material layer.

8. The light-emitting diode package structure of claim 6, wherein the first conductive type semiconductor substrate is a P-doped material layer and the second conductive type region is an N-doped material layer.

* * * * *